(12) United States Patent
Andersen et al.

(10) Patent No.: US 6,529,402 B1
(45) Date of Patent: Mar. 4, 2003

(54) LOW POWER STATIC MEMORY

(75) Inventors: John E. Andersen, Essex Junction, VT (US); Louis Lu-Chen Hsu, Fishkill, NY (US); Li-Kong Wang, Montvale, NJ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/094,533

(22) Filed: Mar. 8, 2002

(51) Int. Cl.[7] .............................................. G11C 11/00
(52) U.S. Cl. .............. 365/154; 365/189.01; 365/230.03
(58) Field of Search ........................... 365/154, 230.03, 365/189.01, 189.05, 230.04, 189.09, 205

(56) References Cited

U.S. PATENT DOCUMENTS 6,373,753 B1 * 4/2002 Proebsting ............. 365/189.09

* cited by examiner

Primary Examiner—David Lam
(74) Attorney, Agent, or Firm—Scully, Scott, Murphy & Presser; Robert M. Trepp

(57) ABSTRACT

A stacked block array architecture.for a SRAM memory for low power applications. The architecture turns on only the required data cells and sensing circuitry to access a particular set of data cells of interest. The wordline delay is reduced by using a shorter and wider wordline wire size. Although less power is consumed, the performance is improved by the reduction in loading of wordlines and bitlines.

8 Claims, 4 Drawing Sheets

| 256 WL | Column 1 | Column 2 | Top Subarray |
|---|---|---|---|
| | SA | | |
| 256 WL | Column 1 | Column 2 | Bottom Subarray |

A SRAM Designed with a Shared Sense
Amplifier Between Upper and Lower Subarrays

Figure 1
*(Prior Art)*

| 128WL | | | Top Subarray |
|---|---|---|---|
| | SA | SA | |
| 128WL | Column 1 | Column 2 | Bottom Subarray |
| 128WL | | | Top Subarray |
| | SA | SA | |
| 128WL | Column 1 | Column 2 | Bottom Subarray |

Enhanced Subarray Architecture for Low Power SRAM

Figure 2

| 128WL | Column 1 | Column 2 | Top Subarray |
|---|---|---|---|
| | SA | SA | |
| | SA | SA | |
| 128WL | | | Bottom Subarray |
| 128WL | Column 1 | Column 2 | Top Subarray |
| | SA | SA | |
| | SA | SA | |
| 128WL | | | Bottom Subarray |

Divided Subarray Architecture

The Stacked Row Architecture

LOW POWER STATIC MEMORY

BACKGROUND OF THE INVENTION

1. Field of the Invention

The present invention relates generally to low power static memories, and more particularly pertains to a low power static memory array architecture that can significantly reduce the power required to drive a wordline, reduce bitline loading and provide sensing with less power. This memory architecture is very suitable for low power embedded cache memories and stand alone memories.

2. Discussion of the Prior Art

Static random access memories are commonly used for low power cache applications, such as in portable, handheld and pervasive devices and systems. Their power consumption can be reduced by limiting the number of circuits actively being used in the operation and retention of the data, with minimum leakage current in a nonactive mode. However due to demands for increased bandwidth and higher data rates, such as in mobile internet applications, higher power is consumed to maintain the additional activated memory cells and circuits in operation.

During a memory access (read or write operation), power consumption in the memory array is used primarily for turning on of the wordline, precharging of the bitline, and sensing of the data.

FIG. 1 illustrates a conventional SRAM memory design wherein the SRAM chip is divided into many subarrays. Each subarray is again divided into many (e.g. 256) addresses with each address being controlled by a single wordline WL of many (e.g. 256) wordlines. In a read or write data access operation, the data has to pass through a sense amplifier SA, and each sense amplifier SA is typically shared by several subarray columns, wherein each column is served by a pair of bitlines. For example, as shown in FIG. 1, one sense amplifier SA is shared by two columns 1 and 2, and is further shared by the top and bottom subarrays. In this arrangement, each sense amplifier SA serves 2 columns in each of 2 subarrays, with each column having 256 memory cells.

Although this arrangement is commonly used for SRAM designs to provide area savings in the SRAM chip, it is not practical for low power SRAM applications. Because in the common SRAM design, to save area, typically 2–4 times the number of sets of data cells are turned on by the same wordline while only one set of data from one set of data cells is needed.

The power consumption for a low power SRAM should be reduced as much as possible by eliminating any unnecessary power consumption. Only the necessary memory cells and sensing circuits should be turned on for data read and write operations.

SUMMARY OF THE INVENTION

Accordingly, it is a primary object of the present invention to provide a low power static memory array architecture that can significantly reduce the power required to drive a wordline, reduce bitline loading and provide sensing with less power. This memory architecture is very suitable for low power embedded cache memories and stand alone memories.

A further object of the subject invention is the provision of a low power static memory architecture with low power consumption that has the same internal data bus and a wide data bandwidth at the interface input/output to accommodate the demands of high bandwidth.

BRIEF DESCRIPTION OF THE DRAWINGS

The foregoing objects and advantages of the present invention for a low power static memory may be more readily understood by one skilled in the art with reference being had to the following detailed description of several embodiments thereof, taken in conjunction with the accompanying drawings wherein like elements are designated by identical reference numerals throughout the several views, and in which:

FIG. 1 illustrates a prior art SRAM designed with a sense amplifier SA shared between different columns and also shared between upper and lower subarrays, and wherein each column has 256 memory or data cells accessed by 256 wordlines.

FIG. 2 shows an enhanced subarray architecture for a low power SRAM pursuant to the present invention wherein each column of 128 data cells has its own sense amplifier SA and only the data cells of interest are turned on during a data access operation, but wherein each sense amplifier SA is still shared between top and bottom subarrays.

DETAILED DESCRIPTION OF THE DRAWINGS

The present invention concerns a SRAM design in which only the necessary memory cells of interest and sensing circuits therefore are turned on for data read and write operations.

FIG. 2 shows an enhanced subarray architecture for a low power SRAM pursuant to the present invention wherein each column (served by a pair of bitlines) of 128 data cells has its own sense amplifier and only the addressed data cells are turned on during a data access operation, but wherein each sense amplifier is still shared between top and bottom subarrays. The length of each wordline WL is reduced because the number of memory cells on each local wordline is reduced by a factor of 2. In this arrangement, each sense amplifier SA serves 1 column in each of 2 subarrays, with each column having 128 memory cells. The wordline loading is thus reduced, which speeds up the slew rate and also cuts down the memory cell transient DC leakage current.

Figures 3, 4:
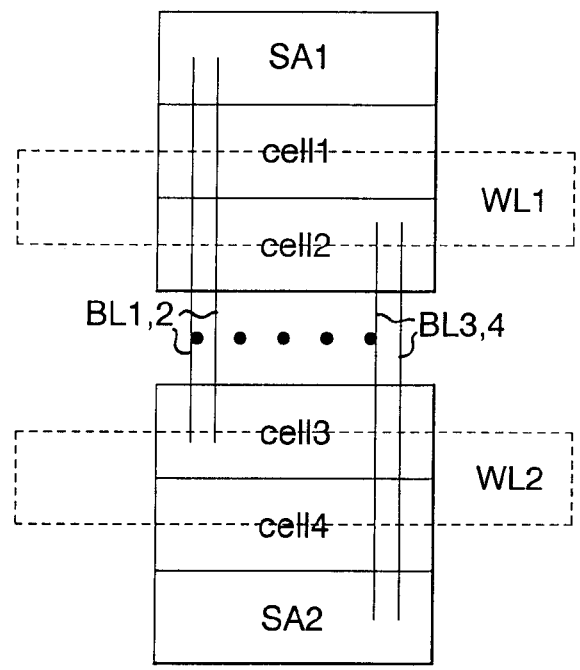
FIG. 3 illustrates a divided subarray architecture pursuant to the present invention wherein top and bottom subarrays are separated and each subarray has its own sense amplifier SA such that each sense amplifier is not shared between top and bottom subarrays.
FIG. 4 illustrates a stacked row architecture pursuant to the present invention wherein each wordline serves two adjacent rows of memory cells and each of two adjacent memory cells served by the same wordline is served by a separate sense amplifier SA, such that the wordline length can be shortened by a factor of 2.

FIG. 3 illustrates a divided subarray architecture pursuant to the present invention wherein top and bottom subarrays are separated and each subarray has its own sense amplifier SA, such that each sense amplifier is not shared between top and bottom subarrays. In this arrangement, each sense amplifier SA serves 1 column in 1 subarray, with each column having 128 memory cells. This improves the read and write speed due to a reduction of bitline loading caused by a reduction of the number of memory cells on each bitline. Most importantly, the power consumption can be significantly reduced through the loading reduction during the precharge and sensing processes.

Although the number of sense amplifiers in FIG. 3 is increased (doubled) relative to the memory array of FIG. 2, the size of each sense amplifiers can be reduced and be smaller than in the memory array of FIG. 2 due to a higher signal from the memory cells. In this case only the memory cells in the section containing the required data are turned on for data accessing operations. Thus, the power consumption can be reduced significantly. The memory array of FIG. 3 can reduce the precharge and sensing power to 25% of the original power required in the memory array of FIG. 1. This also does not include the wordline driving power reduction, which is also reduced by the loading reduction.

The wordline delay can be improved further by a stacked row architecture to cut down the DC transient currents and driving power. FIG. 4 illustrates a stacked row architecture wherein each wordline WL serves two adjacent rows of memory cells and each of two adjacent memory cells served by the same wordline is served by a separate sense amplifier SA. Thus, in FIG. 4, cells 1 and 2 are served by the same wordline 1, and cells 3 and 4 are served by the same wordline 2, and cells 1 and 3 are served by the sense amplifier SA1 via bitlines BL1, 2, and cells 2 and 4 are served by the sense amplifier SA2 via bitlines BL3, 4. With this arrangement, the wordline length can be shortened by a factor of 2. Also since two rows of memory cells use the same wordline address, the width of the wordline can be increased to reduce its resistance. This short and wide wordline conductor can pull-up (or pull-down) the circuits much faster. This also allows the sense amplifiers SA located on both the top and bottom of the subarray to access the memory cells with the wider but shorter wordlines. In this memory design the bitline pairs are interleaved to accommodate a sense amplifier placed on each end of the subarray.

Figure 5:
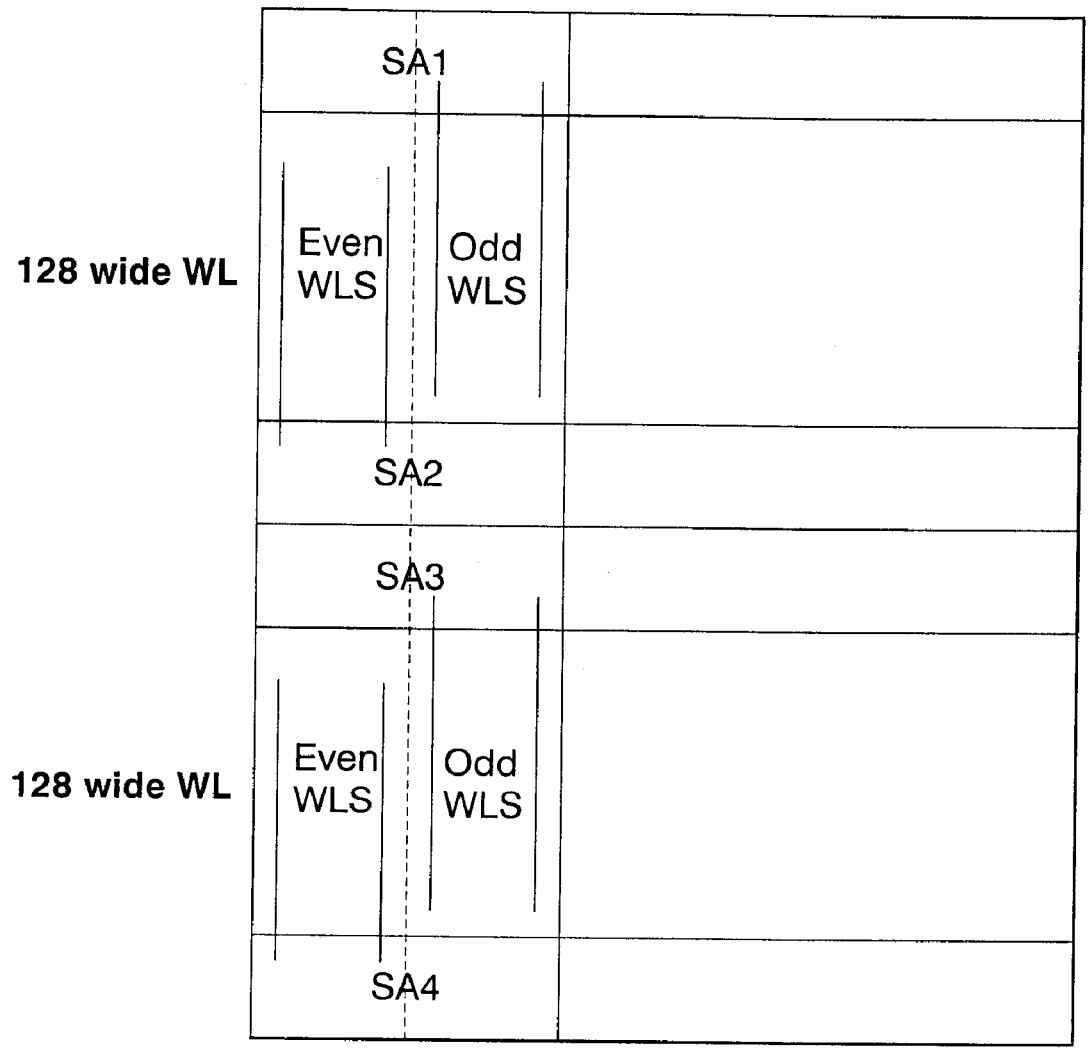
FIG. 5 is a memory array diagram for an interleaved SA stacked row design architecture pursuant to the present invention which is similar to that of FIG. 4.

FIG. 5 illustrates a memory array diagram for an interleaved stacked row design architecture similar to that shown in FIG. 4 and having sense amplifiers similar to the design shown in FIG. 3. Thus, each sense amplifier serves only a single column in a single memory array, and sense amplifier SA1 serves the odd wordlines in the upper subarray, sense amplifier SA2 serves the even wordlines in the upper subarray, sense amplifier SA3 serves the odd wordlines in the lower subarray, and sense amplifier SA4 serves the even wordlines in the lower subarray. Another benefit of this embodiment is that the design and layout of a sense amplifier is easier because it uses a two column pitch sense amplifier design instead of the single column pitch sense amplifier design as described above which is far more difficult to design and lay out.

Figure 6:
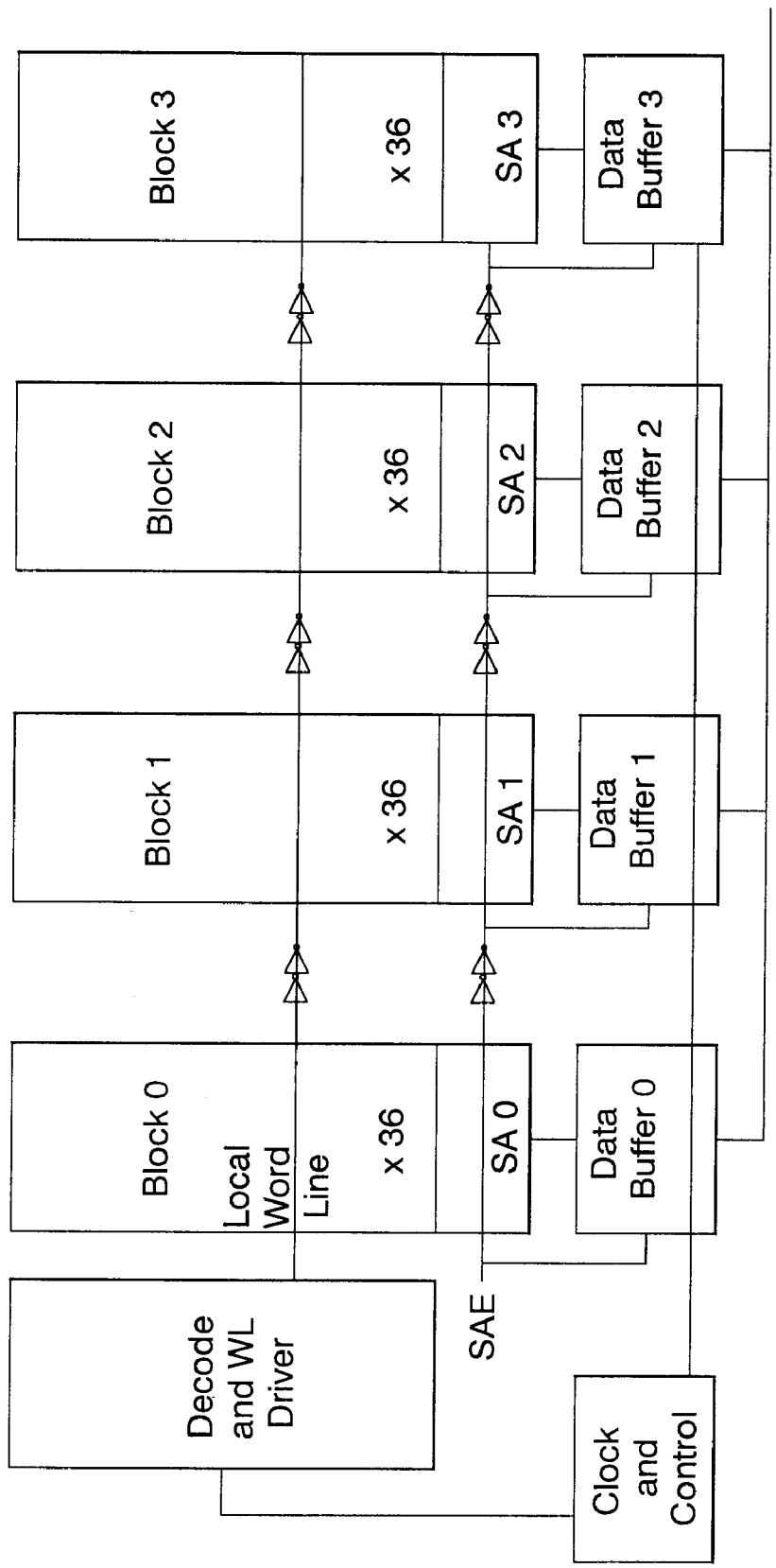
FIG. 6 illustrates a schematic diagram of a low power static memory array design pursuant to the present invention wherein the data can be sent out and read into the memory blocks in a pipeline manner in order to widen the width of each data line from 36 bits to 144 bits.

FIG. 6 illustrates a schematic diagram a low power static memory array design wherein the data can be sent out and read into the memory blocks in a pipeline manner in order to widen the width of each data line from 36 bits to 144 bits.

Each memory block 0–3 is preferably configured similar to the SRAM of FIG. 3 wherein each column of each subarray is served by a separate sense amplifier SA, and each block has a width of 36 columns and has 128 wordlines. The buffer amplifiers which are illustrated between each local wordline of each memory block allow the local wordline to extend through and be shared by the separate memory blocks, and similarly for the buffer amplifiers illustrated between the sense amplifier block SA 0–3 of each separate memory block.

While several embodiments and variations of the present invention for a low power static memory are described in detail herein, it should be apparent that the disclosure and teachings of the present invention will suggest many alternative designs to those skilled in the art.

Having thus described our invention, what we claim as new and desire to secure by Letters Patent is:

1. A low power static random access memory SRAM architecture comprising:

the SRAM comprises a memory array which is divided into a plurality of memory subarrays;

a sense amplifier is provided for each column, having a pair of bitlines, of each memory subarray, and wherein a separate sense amplifier is provided for each column of data cells in each memory subarray, and each sense amplifier is not shared between different subarrays, such that when a set of memory cells in a memory subarray is accessed in a data read or write operation, only the memory subarray and the set of memory cells and sense circuits of interest are accessed and activated in the data read or write operation, to reduce power consumption during each data read or write operation.

2. The SRAM architecture of claim 1, wherein each subarray has 128 wordlines.

3. The SRAM architecture of claim 1, comprising a stacked row memory architecture wherein each wordline serves two adjacent rows of memory cells, and each of two adjacent memory cells served by the same wordline is served by a separate sense amplifier.

4. The SRAM architecture of claim 3, wherein each wordline comprises a short and wide conductor.

5. The SRAM architecture of claim 3, wherein bitline pairs are interleaved to accommodate a sense amplifier placed at each end of each subarray.

6. The SRAM architecture of claim 3, wherein sense amplifiers are laid out at both the top and bottom of each column of each subarray, and each sense amplifier senses one half of the number of memory cells in each column.

7. The SRAM architecture of claim 1, wherein the data is sent out of and read into the memory blocks in a pipeline manner in order to widen the width of each data line.

8. The SRAM architecture of claim 1, wherein the layout of each sense amplifier uses a two column pitch sense amplifier design.

* * * * *